United States Patent [19]

Imaoka

[11] Patent Number: 4,597,804
[45] Date of Patent: Jul. 1, 1986

[54] METHODS OF FORMING DENUDED ZONE IN WAFER BY INTRINSIC GETTERING AND FORMING BIPOLAR TRANSISTOR THEREIN

[75] Inventor: Kazunori Imaoka, Komae, Japan

[73] Assignee: Fujitsu Limited, Kawasaki, Japan

[21] Appl. No.: 598,544

[22] Filed: Apr. 12, 1984

Related U.S. Application Data

[63] Continuation-in-part of Ser. No. 356,486, Mar. 9, 1982, abandoned.

[30] Foreign Application Priority Data

| Mar. 11, 1981 | [JP] | Japan | 56-35021 |
| Mar. 11, 1981 | [JP] | Japan | 56-35022 |
| Mar. 11, 1981 | [JP] | Japan | 56-35023 |
| Mar. 11, 1981 | [JP] | Japan | 56-35024 |

[51] Int. Cl.$^4$ .............. H01L 21/263; H01L 21/322
[52] U.S. Cl. .................. 148/1.5; 29/576 B; 29/576 T; 148/187; 357/34; 357/91
[58] Field of Search ............ 29/576 B, 576 T; 148/1.5, 187; 357/34, 91

[56] References Cited

U.S. PATENT DOCUMENTS

| 4,116,719 | 9/1978 | Shimizu et al. | 148/1.5 |
| 4,144,099 | 3/1979 | Edmonds | 148/1.5 |
| 4,149,905 | 4/1979 | Levinstein et al. | 148/1.5 |
| 4,220,483 | 9/1980 | Cazcarra | 148/1.5 |
| 4,231,809 | 11/1980 | Schmitt | 148/1.5 |
| 4,314,595 | 2/1982 | Yamamoto et al. | 148/1.5 |
| 4,332,627 | 6/1982 | Schmitt et al. | 148/1.5 |
| 4,376,657 | 3/1983 | Nagasawa et al. | 148/1.5 |
| 4,437,922 | 3/1984 | Bischoff et al. | 148/1.5 |

FOREIGN PATENT DOCUMENTS

| 0040250 | 4/1981 | Japan | 29/576 T |
| 56-49532 | 5/1981 | Japan | 29/576 T |

OTHER PUBLICATIONS

Kanamori et al., J. Appl. Phys. 50, (1979), 8095.
Isomae et al., J. Appl. Phys. 55, (1984), 817.
Tsuya et al., Appl. Phys. Letts. 36, (1980), 658.
Kishino et al., Jap. Jour. Appl. Phys. 21, (1982), 1–12.
"A Defect Control Technique for the Intrinsic Gettering in Silicon Device Processing", Seigo Kishino et al., *Japanese Journal of Applied Physics*, vol. 23, No. 1, Jan. 1984, pp. L9–L11.

*Primary Examiner*—Upendra Roy
*Attorney, Agent, or Firm*—Staas & Halsey

[57] ABSTRACT

A variety of methods are applicable to production of semiconductor devices in which the active layer is produced in a denuded zone which is thin and free of defects. This denuded zone in combination with a high concentration of crystalline defects contained in a deep layer of the semiconductor device, allows the semiconductor device to enjoy the function of the intrinsic gettering effect. A variety of improvements, including a decrease in the overall production time, removal of limitations due to the oxygen concentration of a wafer, etc. is realized by introducing an idea that the annealing temperature is increased and/or decreased gradually at a predetermined rate. A variety of such improved annealing processes being combined with each other and/or to a variety of conventional annealing processes, aiming at a higher magnitude of the intrinsic gettering effect. This improvement is further modified to be combined with epitaxy to diversify the uses of a denuded zone.

25 Claims, 17 Drawing Figures

METHODS OF FORMING DENUDED ZONE IN WAFER BY INTRINSIC GETTERING AND FORMING BIPOLAR TRANSISTOR THEREIN

This application is a continuation-in-part of application Ser. No. 356,486, filed Mar. 9, 1982, now abandoned.

BACKGROUND OF THE INVENTION

The present invention relates to methods applicable to production of semiconductor devices. More specifically, the present invention relates to a variety of methods which can be employed either individually or in combination in the production of wafers of a semiconductor, and particularly of silicon (hereinafter referred to as Si.), to utilize the function of the intrinsic gettering effect on the semiconductor wafers. More precisely, the present invention relates to a variety of methods for production of wafers of a semiconductor, specifically of Si, wherein the semiconductor wafers have a shallow or surface region, which is a denuded zone which is clear and thin enough to enable the intrinsic gettering effect to function to a satisfactory extent, and a deep or internal region which contains a high concentration of crystalline defects having a large size which allow an increase of the intrinsic gettering effect.

An intrinsic gettering effect is effective to produce and maintain a denuded zone which is fairly free from crystalline defects and which is employed as the active layer of a semiconductor device. This effect which is publicly known in the prior art, is based on a principle that an internal region of a semiconductor wafer containing a large quantity or concentration of crystalline defects, has a function to absorb the impurities e.g. oxygen, carbon, et al., each of which has the possibility of producing crystalline defects therewith and which are contained in the surface region of the semiconductor wafer. The remaining surface region of the semiconductor wafer has a defect free portion, that is, the remaining surface region has a thickness range from several micrometers through several tens of micrometers of the semiconductor wafer and acts as a denuded zone.

It is known that a smaller thickness of a denuded zone located in the shallow region of a semiconductor wafer, as well as a larger concentration of crystalline defects contained in the deep or internal region of the semiconductor wafer, is effective to cause a larger intrinsic gettering effect. Therefore, taken only from the viewpoint of this intrinsic gettering effect, a smaller thickness is preferable for a denuded zone. However, since the thickness of a denuded zone is required to exceed that of an active layer of which exemplary thicknesses are 5 micrometers, and 3 micrometers, respectively for a bipolar transistor and for a MOS transistor, the thickness of the denuded zone is required to be approximately 10 micrometers for a bipolar transistor and 6 micrometers for a MOS transistor.

In the prior art, two different methods are available to produce a semiconductor wafer which is allowed to utilize the function of the intrinsic gettering effect. One method produces a semiconductor which has a shallow or surface region comprising a denuded zone free of crystalline defects and a deep or internal region containing crystalline defects large in size. This is a two-step method which comprises a first step in which a semiconductor wafer, containing impurities e.g. oxygen, carbon et al., is annealed at a relatively low temperature (in the range of 600° through 900° C.) for the purpose of producing a high concentration of defect nuclei in the semiconductor wafer, and a second step in which the semiconductor wafer is annealed at a relatively high temperature (in excess of 1,000° C.) for the purpose of causing the high concentration of defect nuclei to grow to a high concentration of crystalline defects. The other method is a three-step method which is an improvement of the foregoing two-step method. The three-step method comprises (a) a first step in which a semiconductor wafer produced employing the Czochralski method and which contains impurities, e.g. oxygen with a concentration range of 0.5 through $2.0 \times 10^{18}/cm^3$, is annealed for approximately 20 hours in nitrogen gas at a high temperature of approximately 1,100° C. for the purpose of diffusing the impurities out of the shallow region or the surface region of the semiconductor wafer; (b) a second step in which the semiconductor wafer is annealed for approximately 40 hours in nitrogen gas at a relatively low temperature, in the approximate temperature range of 600° through 900° C., for the purpose of causing the impurities remaining in the deep region or the internal region of the semiconductor wafer to grow to a high concentration of defect nuclei, the remaining shallow region or the surface region of the semiconductor wafer contain no impurities, that is a defect-free region, and (c) a third step in which the semiconductor wafer is annealed for approximately 20 hours in nitrogen gas at a relatively high temperature of approximately 1,050° C. for the purposes (i) of causing the high concentration of defect nuclei to grow to a high concentration of crystalline defects in the deep region or the internal region of the semiconductor wafer and (ii) of producing a denuded zone in the shallow region or the surface region.

Any of the foregoing methods available in the prior art for producing a semiconductor wafer which is allowed to utilize the function of the intrinsic gettering effect has drawbacks described below. A first drawback is the extremely long period of time required for the process. Specifically, in the case of the three-step method, the process requires approximately 80 hours, which is too long particularly from a realistic viewpoint. Albeit the two-step method requires a shorter length of time, but the quality of the denuded zone produced employing this method is unsatisfactory in comparison with the quality of the denuded zone produced employing the three-step method. A second drawback is caused by an unsatisfactory thickness of a protection layer which covers the surface of a semiconductor wafer during the period in which one of the foregoing methods of production of the semiconductor wafer which utilizes the function of the intrinsic gettering effect for the purpose of inhibiting surface defects from appearing, particularly in the surface region of the semiconductor wafer. This unsatisfactory thickness of the surface protection results in a requirement of an additional step to remove the surface region containing the foregoing surface defects. The third drawback is caused by unsatisfactory control of the thickness of the denuded zone. In other words, it is not necessarily easy to control the thickness of the denuded zone produced employing any of the foregoing methods, particularly because this control is influenced by the grade of concentration of oxygen contained in a semiconductor wafer. A fourth drawback is a possibility in which a semiconductor wafer warps during the process, due to a rather high temperature required. A fifth drawback is a possibility in which a denuded zone, once produced in a semiconductor wafer, is rather easily lost during later thermal processes which inevitably are contained in a process for producing a semiconductor device. A sixth drawback is the rather unsatisfactory magnitude of the intrinsic gettering effect which can be expected from any of the semiconductor wafers produced employing any of the methods based on annealing processes, particularly in the case where a bipolar semiconductor is produced in such a semiconductor wafer.

SUMMARY OF THE INVENTION

The first object of the present invention is to provide a method for producing an Si wafer which utilizes the function of the intrinsic gettering effect or an Si wafer having a shallow or surface region of a denuded zone and a deep or internal region containing a high concentration of crystalline defects large in size. An improvement is realized in that the length of time required for the production of such an Si wafer is decreased considerably to good control of the thickness of the denuded zone is provided.

The second object of the present invention is to provide a method for producing an Si wafer which utilizes the function of the intrinsic gettering effect or an Si wafer having a shallow or surface region of a denuded zone and a deep or internal region containing a high concentration of crystalline defects large in size, wherein better control of the thickness of the denuded zone, and particularly for an Si wafer having a high concentration of oxygen.

The third object of the present invention is to provide an effective method to maintain a denuded zone once produced in an Si wafer, even during a later thermal process included in the process for producing the semiconductor device.

The fourth object of the present invention is to provide an effective method to inhibit an Si wafer from warping during a thermal process for producing a semiconductor device.

The fifth object of the present invention is to provide a method for producing an Si wafer which utilizes the function of the intrinsic gettering effect or has a shallow or surface region which is a denuded zone and a deep or internal region containing a high concentration of crystalline defects large in size. The Si wafer which allows an improved intrinsic gettering effect over that available from any of the methods based on an annealing process, allows itself to be a material for producing a bipolar transistor.

To achieve the first object, a method for producing a semiconductor device in accordance with the present invention includes one or more annealing processes applied to an Si wafer, and the annealing temperature is increased from the temperature range of 500° through 900° C. to a temperature range of 950° through 1,300° C. at a temperature increase rate not exceeding 14° C./min. It is more effective for an Si wafer containing an oxygen concentration in excess of $1.5 \times 10^{18}/cm^3$, that the temperature increase rate be selected from the range of 5° through 14° C./min. for the first annealing process followed by the second or later annealing processes conducted at a temperature increase rate selected from the range not exceeding 14° C./min. Incidentally, it is more effective, for an Si wafer containing an oxygen concentration not exceeding $1.5 \times 10^{18}/cm^3$, that the temperature increase rate is selected from the range not exceeding 5° C./min. for the first annealing process followed by the second or later annealing processes conducted at a temperature increase rate selected from the range not exceeding 14° C./min.

It is noted that any of the foregoing methods do not utilize the idea that the annealing temperature is gradually increased or decreased. The present invention is characterized by introduction of this idea which is effective in decreasing the overall length of the process and also in decreasing the extent of potential damages which an Si wafer incurs, due to exposure to high temperature.

To achieve the second object, a method for producing a semiconductor device in accordance with the present invention includes a first step in which an Si wafer is annealed at a temperature in excess of 950° C. for a period in excess of 10 min. and a second step in which one or more annealing processes is applied to the Si wafer, the annealing temperature being increased at a rate not exceeding 14° C./min. It is more effective if the temperature increase rate is selected from the range not exceeding 5° C./min. for the first annealing process of the second step followed by the second or later annealing processes conducted at a temperature increase rate selected from the range not exceeding 14° C./min.

To achieve the third and fourth objects, a method for producing a semiconductor device in accordance with the present invention includes one or more thermal steps applied to an Si wafer having a denuded zone therein and the original or major purpose is to produce one or more semiconductor device elements in the foregoing Si wafer, each of the thermal steps being conducted by increasing the temperature from a temperature range of 500° through 900° C. to a temperature range of 950° through 1,300° C. and by decreasing the temperature from the temperature range of 950° through 1,300° C. to a temperature range of 500° through 900° C. It is more effective if the thermal process is conducted at temperature increase and decrease rates of 14° C./min. or less.

To achieve the fifth object, a method for producing a bipolar transistor in accordance with the present invention includes a first step in which an Si wafer is annealed employing a process in which the annealing temperature is increased at a rate not exceeding 5° C./min. and a second step in which an epitaxial layer containing one or more impurities with one conductivity and having a thickness in excess of 2 micrometers, is grown on the Si wafer. It is more effective if the foregoing first step is conducted plural times and if the temperature increase rate is selected to be slower for the first annealing process of the first step than for the later annealing phases of the first step. One modification of this embodiment for the production of a bipolar transistor includes a first step in which a first epitaxial layer is grown on an Si wafer containing impurities in its surface region, a second step in which one or more impurities having one conductivity is introduced in a selected area of the foregoing epitaxial layer for production of a buried layer, and a third step in which a second epitaxial layer containing one or more impurities has a conductivity different from the foregoing impurities.

BRIEF DESCRIPTION OF THE DRAWINGS

The present invention, together with its various features and advantages, can be readily understood from the following more detailed description presented in conjunction with the following drawings, in which.

DESCRIPTION OF THE PREFERRED EMBODIMENTS

In the following description, each of the major embodiments in accordance with the present invention will be presented; on the assumption that each method is applied to an Si wafer, produced employing the Czochralski method, which allows oxygen to remain in the Si wafer with a concentration range of 0.5 through $2.0 \times 10^{18}/cm^3$.

First, described below will be a method for producing an Si wafer which utilizes the function of the intrinsic gettering effect, wherein an improvement is realized to considerably decrease the length of time required for the production thereof.

Figure 1:
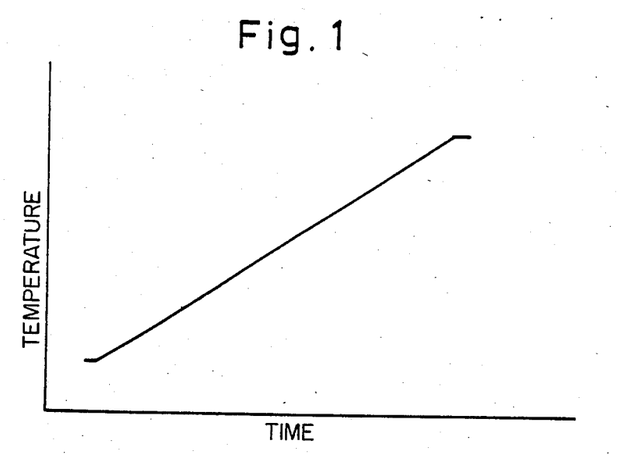
FIG. 1 is a graph of the relationship between the temperature and time of an annealing process included in a method for producing an Si wafer which utilizes the function of the intrinsic gettering effect in accordance with one embodiment of the present invention.

Referring to FIG. 1, one or more annealing processes is applied to an Si wafer in which the annealing temperature is increased from a low temperature (e.g. a temperature selected from the range of 500° through 900° C.) to a high temperature (e.g. a temperature selected from the range of 950° through 1,300° C.) at a predetermined rate which does not exceed 14° C./min. The foregoing description of the methods available in the prior art indicates that any of such methods comprises plural annealing steps of which the annealing temperature is different from one another and each of such plural steps has a function different from one another. A method in accordance with one embodiment of the present invention comprises an annealing step in which the annealing temperature is gradually increased and which has plural functions taking place in progression following the gradual increase in the annealing temperature. This is effective in eliminating the transition period, resulting in a decrease of the overall process time.

Figure 2:
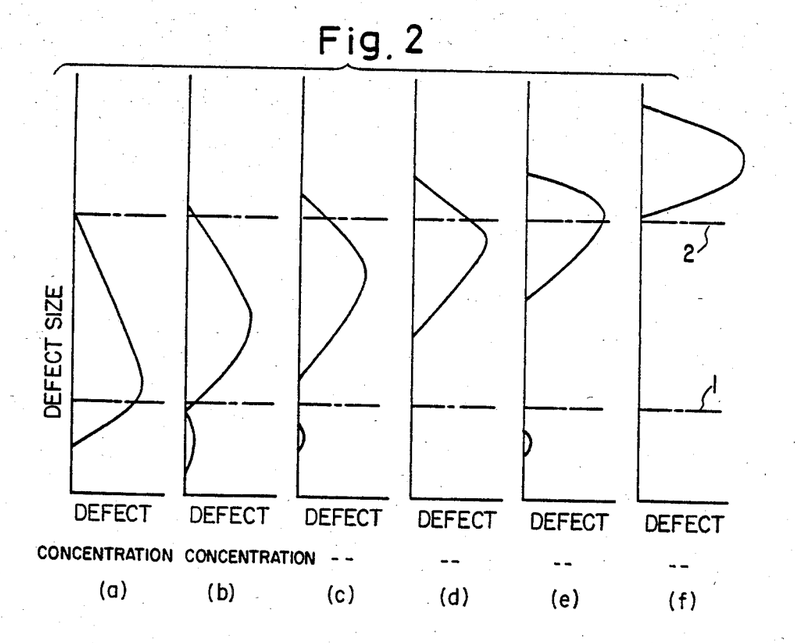
FIGS. 2(a) through (f) are a group of graphs of the relationship between the size and the concentration of crystalline defects or the nuclei thereof existing in the deep or internal region of an Si wafer and which show in combination the progress of growth of such nuclei of crystalline defects toward crystalline defects.

Referring to FIGS. 2(a) through (f), each illustrates the relationship between the size and the concentration of crystalline defects or the nuclei thereof located in the deep or internal region of the Si wafer for several exemplary phases in the annealing process of a method in accordance with one embodiment of the present invention. The process of growing crystalline defects having a larger size and which are grown in a deep region of the Si wafer is described below. Chain lines 1 and 2 respectively depict a first critical size of crystalline defects or nuclei thereof which are lost by annealing at 750° C. and a second critical size of crystalline defects or nuclei thereof which are observed after etching in a Preferential Wright Etching Solution. FIG. 2(a) illustrates that an Si wafer contains few nuclei having a size larger than the second critical size. FIG. 2(b) illustrates that, under the initial phase of the annealing process or during the annealing process conducted at a low temperature range, most of the nuclei grow to those having larger sizes and some of the nuclei grow to defects having sizes in excess of the second critical size. The existence of such nuclei can be detected by a methodology such as an etching method. A small quantity of nuclei having small sizes are born in the deep region or the internal region of the Si wafer. FIG. 2(c) illustrates that, under the middle phase of the annealing process or during the annealing process conducted at a middle temperature range, the nuclei further grow to those having larger sizes following the increase in the annealing temperature. The small quantity of nuclei having small sizes and which were newly born during the initial phase are gradually dismissed in the deep region or the internal region of the Si wafer. Incidentally, impurities such as oxygen diffuse out of the shallow region or the internal region of the Si wafer. FIG. 2(d) illustrates that, under the last phase of the annealing process or during the annealing process conducted at a high temperature range, the nuclei and defects further grow to those having larger size and a considerable quantity of them grow to defects having sizes in excess of the second critical size in the deep or internal region of the Si wafer. Incidentally, by this time, a denuded zone has been produced in the shallow or surface region of the Si wafer. The higher the high temperature or the final temperature is, the larger the defect size is. However, the higher the high temperature or the final temperature is, the larger the thickness of the denuded zone is, decreasing the magnitude of the intrinsic gettering effect. FIG. 2(e) illustrates that, during a process in which the annealing temperature is decreased, nuclei having sizes in excess of the first critical size go on growing to a larger size, and that a small quantity of nuclei having small sizes are born in the deep or internal region of the Si wafer. One part of these nuclei can be dismissed by plural application of the foregoing annealing process. This plural application of the foregoing annealing process can not be accompanied by birth of new nuclei in the surface region of the Si wafer since most of the oxygen has been diffused out of the surface region of the Si wafer. FIG. 2(f) illustrates the position after the foregoing annealing process was applied to an Si wafer a plural amount of times. A number of defects having sizes in excess of the second critical size are available in the deep or internal region of the Si wafer and a denuded zone completely free from defects and/or nuclei thereof has grown in the surface or shallow region of the Si wafer.

The foregoing description has clarified that, in a method in accordance with one embodiment of the present invention, nuclei of crystalline defects grow to those having a larger size without changing the quantity or the concentration thereof. In other words, all the nuclei having a size not exceeding the first critical size are lost and all the defects and nuclei thereof having a size in excess of the first critical size grow to defects having a larger size, enabling the Si wafer to increase the magnitude of the intrinsic gettering effect.

Since the first critical size is determined by the lowest temperature in the annealing process, and also since the highest temperature or the final temperature is one of the major parameters which determine the thickness of a denuded zone, the magnitudes of the lowest temperature or the initial temperature and the highest temperature or the final temperature are important parameters which determine the thickness of the denuded zone.

Figure 3:
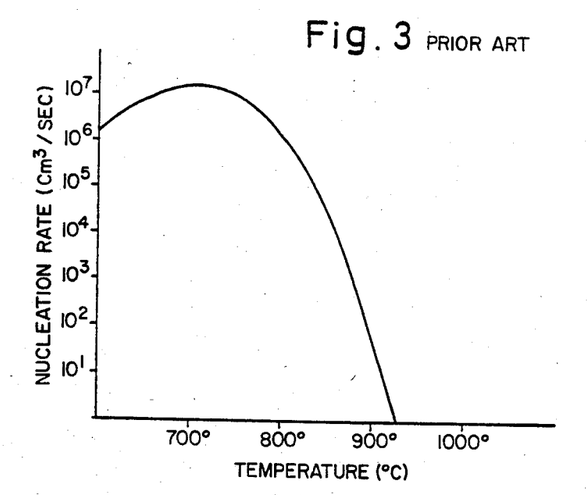
FIG. 3 is a graph of the relationship between the nucleation rate and the annealing temperature.

For the initial temperature, a lower temperature is more preferable, and the temperature can be selected from the temperature range of 500° through 900° C. from a practical viewpoint. FIG. 3 illustrates the relationship between the nucleation rate and the annealing temperature. Referring to the figure, a higher nucleation rate range is observed in the temperature range of 650° through 850° C. Therefore, the initial temperature or the lowest temperature is preferably selected from the range of 650° through 850° C.

Figure 4:
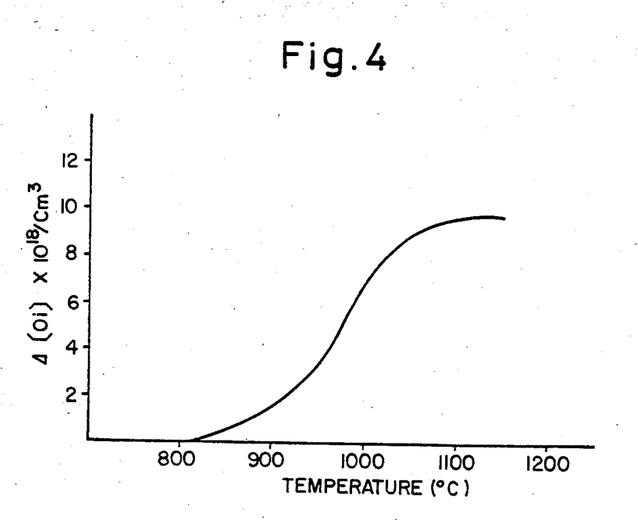
FIG. 4 is a graph of the relationship between the decrement in the oxygen concentration and the annealing temperature T°C., the relationship being determined by an experiment which is elaborated on, in the specification.

As described earlier, a higher temperature produces a thicker denuded zone, thereby decreasing the intrinsic gettering effect. From a practical viewpoint the final temperature or the highest temperature is preferred to be less than 1,300° C. FIG. 4 illustrates the relationship between the decrement in the oxygen concentration and the annealing temperature T°C. The decrement is determined as a result of a plurality of experimental annealings comprising of a first step in which an Si wafer having an initial oxygen concentration of $1.8 \times 10^{18}/cm^3$ is annealed for 4 hours at 650° C., a second step in which the Si wafer is annealed at a temperature increasing at a rate of 2° C./min. up to T°C., and a third step in which the Si wafer is further annealed for 3 hours at T°C. Referring to FIG. 4, the temperature range in excess of 950° C. is determined to be effective for growing crystalline defects. As a result, the final temperature or the highest temperature is preferably selected from the range of 950° through 1,300° C.

Figure 5:
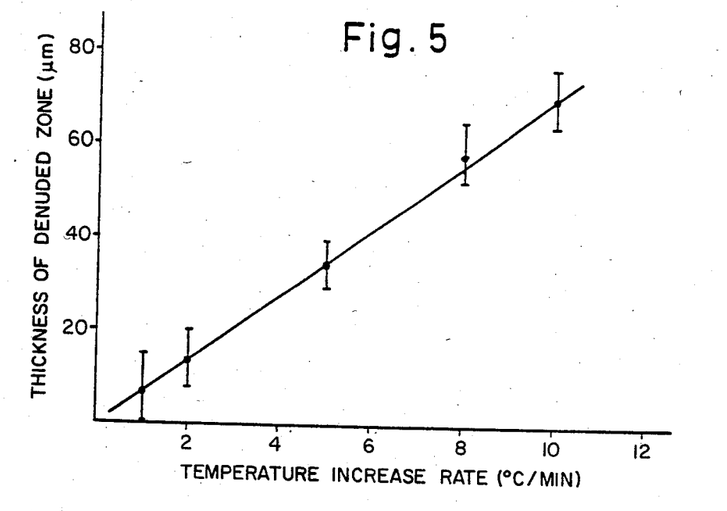
FIG. 5 is a graph of the relationship between the thickness of a denuded zone and the annealing temperature increase rate for an Si wafer having an oxygen concentration in excess of $1.5 \times 10^{18}/cm^3$, the relationship being determined by an experiment which is elaborated on, in this specification.

The most important parameter for the annealing process included in the method in accordance with this embodiment of the present invention is the temperature increase rate, which is the major parameter for determining the thickness of a denuded zone and the length of time required for production of a denuded zone. Since the effect of the temperature increase rate toward the thickness of the denuded zone varies depending on the concentration of oxygen contained in an Si wafer, this effect will be discussed below. FIG. 5 illustrates the relationship between the thickness of a denuded zone and the annealing temperature increase rate for an Si wafer having an oxygen concentration in excess of $1.5 \times 10^{18}/cm^3$. Specifically, the graph shows results of experiments conducted for an Si wafer having an oxygen concentration of $1.8 \times 10^{18}/cm^3$, having an initial or lowest temperature and a final or highest temperature at 750° C. and 1,100° C., respectively, and having an annealing time of 30 minutes to reach the final or highest temperature. Referring to FIG. 5, a decrease in the temperature increase rate produces a smaller thickness of the denuded zone. The graph was produced by plotting the intermediate thicknesses between the defect free region and the region full of defects which were determined by observation made after an etching conducted employing a Preferential Wright Etching Solution. As a result, the graph shows that a wafer having a denuded zone produced employing the temperature increase rate range of 1° through 5° C./min. is not employable because some of the defects are potentially located close to the surface of the wafer. Therefore, a method in accordance with this embodiment of the present invention, whenever being applied to an Si wafer having an oxygen concentration in excess of $1.5 \times 10^{18}/cm^3$, should include at least one annealing process conducted at a temperature increase rate selected from the range of 5° through 14° C./min. It was discovered that defects hardly grow in the deep or internal region of an Si wafer when the annealing process is carried out at a temperature increase rate in excess of 14° C./min. It was also discovered that a lower temperature increase rate causes a higher concentration of the deep or internal defects.

Figure 6:
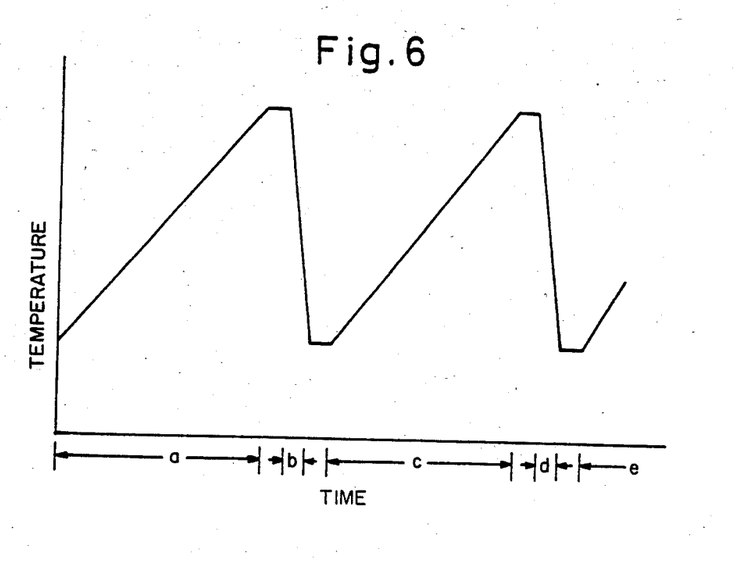
FIG. 6 is a graph of the temperature vs. time tendency of the thermal cycles of a method in accordance with one embodiment of the present invention.

It is known that defects scarcely grow in any region of an Si wafer having an oxygen concentration not exceeding $1.5 \times 10^{18}/cm^3$. However, it was discovered that defects readily grow in the deep region or the internal region of an Si wafer having an oxygen concentration not exceeding $1.5 \times 10^{18}/cm^3$ when an annealing process has a temperature increase rate range not exceeding 5° C./min. As a result, it was concluded that a method in accordance with another embodiment of the present invention applicable to an Si wafer having an oxygen concentration not exceeding $1.5 \times 10^{18}/cm^3$, include at least one annealing process to be conducted at a temperature increase rate range not exceeding 5° C./min. It is of course allowable to employ plural annealing steps for one wafer. It is interesting than an insignificant growth of defects is recognized for this embodiment even during the period in which the annealing temperature is decreased, albeit the growth rate is less than that for the temperature increase period. This indicates a possibility to actively utilize this temperature decrease period when plural annealing steps are employed. The utilization of the temperature decrease process is not accompanied by an excessively long additional period of time as in the case where plural annealing processes are repeated in a single furnace. FIG. 6 illustrates the temperature vs. time tendency of the thermal cycles of a method in accordance with one embodiment of the present invention. Referring to FIG. 6, a, b, c, d and e are the time periods respectively of the first temperature increase process, the first temperature decrease process, the second temperature increase process, the second temperature decrease process and the third temperature increase process. The preferred length relationship among these time periods are:

$$a \geqq c \geqq e \geqq b \approx d$$

As described earlier, the first temperature increase process is most important for the foregoing embodiment. In other words, the second and later temperature increase processes are expected to increase the size of the nuclei which have been born during the first temperature increase process. Therefore, it is realistic to employ the temperature increase rate defined by the foregoing embodiments for the first annealing process and relatively larger temperature increase rates selected from the range not exceeding 14° C./min. for the second and later annealing processes, for the purpose of decreasing the overall length of time of the annealing processes included in this method. It was determined that three or more annealing processes are sufficient for production of an Si wafer having a good denuded zone. That is, a method comprising three annealing processes of which the lowest or initial temperature is 650° C., of which the temperature increase rate and the temperature decrease rate are 2° C./min. and of which the highest or final temperature is 1,100° C. at which the temperature is maintained unchanged for 40 minutes, is effective to decrease the overall length of time for producing an Si wafer which utilizes the function of the intrinsic gettering effect.

The feature of this embodiment of the present invention can be summarized in that a high concentration of crystalline defect nuclei is born during the low temperature period of a temperature increase process, and the high concentration of crystalline defect nuclei is allowed to grow to a high concentration of crystalline defects during the high temperature period of the temperature increase process, resulting in a high efficiency or a shorter length of time for producing an Si wafer which utilizes the function of the intrinsic gettering effect. Repetition of the foregoing thermal processes is effective to control the average size of the defect contained in the high concentration of the crystalline defects. A longer period of the high temperature annealing and/or the low temperature annealing are or is effective for the function of this embodiment, albeit this is needless in the case where the high temperature is sufficiently high or the low temperature is sufficiently low.

An oxidizing gas can be employed as the atmosphere for this thermal process. However, from the viewpoint of control of the thickness of a denuded zone, an inert gas is preferable.

It is effective if the initial high temperature annealing process is carried out in an oxidizing gas and the later processes are conducted in an inert gas, because an SiO$_2$ film will have grown during the initial high temperature annealing process to protect the Si wafer during the thermal processes.

When a protection film of SiO$_2$ is employed, the SiO$_2$ film serves the purpose of cleaning the surface of the Si wafer, when it is removed. Therefore, oxidation is preferable rather than chemical vapor deposition for producing this protective film.

The foregoing description has clarified that an improvement to considerably decrease the overall length of time required for production is realized in a method for producing an Si wafer which utilizes the function of the intrinsic gettering effect in accordance with one embodiment of the present invention.

Second, described below will be a method for producing an Si wafer which utilizes the function of the intrinsic gettering effect, wherein better control of the thickness of a denuded zone is realized, particularly for a semiconductor wafer containing a high concentration of oxygen.

Specifically, the object of this embodiment is to enable a denuded zone to be produced in an Si wafer containing oxygen with a concentration in excess of $1.5 \times 10^{18}/cm^3$. As described earlier, the less the temperature increase rate is, the less the thickness the denuded zone is. However, a slower temperature increase rate causes crystalline defects to be produced in the shallow or surface region of an Si wafer containing a high concentration of oxygen causing a drawback in which a slower temperature increase rate can not be employed for an Si wafer containing a high concentration of oxygen. This embodiment removes this drawback by the application of an annealing process to an Si wafer that contains much oxygen, at a temperature in excess of 950° C. for a period in excess of 10 minutes, prior to application of one or more annealing processes. The annealing temperature is increased at a rate not exceeding 14° C./min. for the purpose of dismissing the defect nuclei existing in the shallow or surface region and to diffuse the oxygen out of the shallow or surface region of the Si wafer. If the temperature increase rate is selected to be less than 5° C./min. for the initial phase or the subsequent phases of the thermal processes which are conducted while the annealing temperature is gradually increased, a thinner denuded zone is grown.

Figure 7:
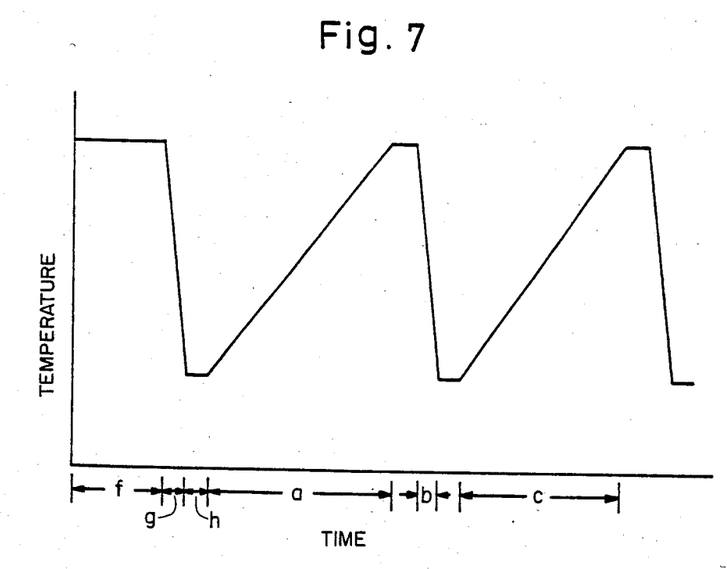
FIG. 7 is a graph of the temperature vs. time tendency of the thermal cycles of a method in accordance with another embodiment of the present invention.

FIG. 7 is a graph of the temperature vs. time tendency of the thermal cycles of a method in accordance with this embodiment. Referring to FIG. 7, f is a period in which an Si wafer is annealed within a period from 10 minutes to 10 hours minutes at 1,100° C. for the purpose of getting rid of the crystalline defect nuclei in the shallow or surface region of the Si wafer and diffusing oxygen out of the shallow or surface region. It is noted that the annealing temperature is required to be in excess of 950° C. to be effective for the foregoing purposes. On the other hand, the temperature is required to be less than 1,300° C. to avoid buckling of the Si wafer. The annealing period is required to exceed 10 minutes. The annealing period is, preferably, from 10 minutes to 10 hours. If the annealing period is less than 10 minutes, no annealing effect results. In contrast, if the annealing period is more than 10 hours, it conflicts with the purpose of the present invention which is to decrease the overall length of time of the annealing process. A preferable length of the time is 60 minutes. It is preferable that the Si wafer be covered by an SiO$_2$ protection film during this thermal process. It is also possible to grow an SiO$_2$ film during this thermal process rather than the Si wafer being covered by the SiO$_2$ film from the beginning. The indicated g is a period in which the annealing temperature is decreased to 650° C. Since this process has little effect on the function which is the major object of this embodiment, no particular attention is required to this period. In other words, an abrupt decrease is allowed for the temperature during this period, for example, there is no harm in directly pulling out the substrate from the annealing furnace and cooling the substrate to room temperature. The indicated h is a period in which the Si wafer is annealed for a period 0 through 15 hours at 650° C. Since this annealing process also has little effect on the function of this embodiment, this annealing can be eliminated. The indicated a is a period in which the annealing temperature is increased at a rate of 2° C./min. from 650° C. to 1,100° C. Since the criteria of a denuded zone is determined in this period of initial high temperature treatment time, this period is the most important parameter which establishes the limitations for this embodiment. A temperature increase rate not exceeding 5° C./min. allows a denuded zone having a thickness of 10 through 30 micrometers to grow on an Si wafer having a relatively high oxygen concentration in excess of $1.5 \times 10^{18}/cm^3$. One or two cycles of temperature increase at a rate of 1° through 3° C./min. or three cycles of temperature increase at a rate of 3° through 5° C./min. was determined satisfactory for production of an Si wafer satisfying the object of this embodiment.

A method in accordance with this embodiment is not effective to produce a denuded zone in an Si wafer having an oxygen concentration not exceeding $1.5 \times 10^{18}/cm^3$, however a method in accordance with this embodiment is effective to clean the surface of a wafer, regardless of the magnitude of oxygen concentration. It is noted that a longer low temperature annealing period, h shown in FIG. 7, enables a method in accordance with this embodiment to produce a denuded zone in an Si wafer having a smaller oxygen concentration. An experimental result shows a low temperature annealing conducted for 2 hours at e.g. 650° C. is sufficient for this purpose.

Figure 8:
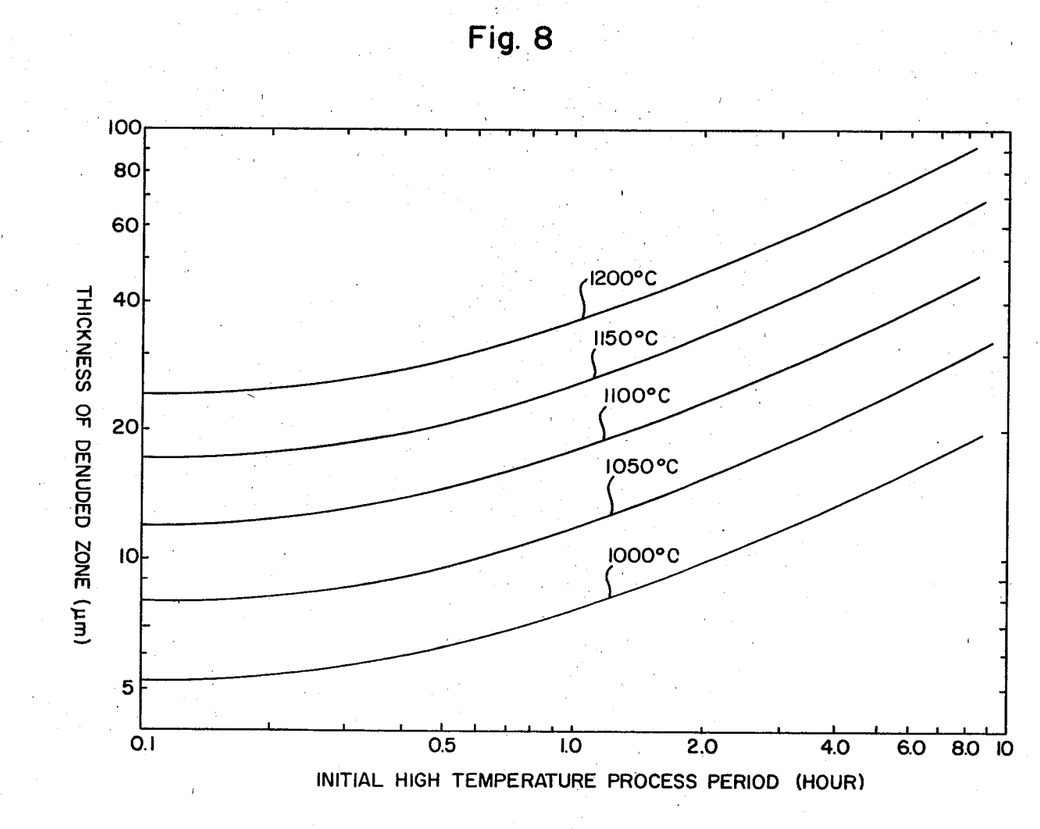
FIG. 8 is a graph of the relationship between the thickness of a denuded zone and the length of the initial high temperature annealing period shown with the annealing temperature as the parameter, the relationship being determined by an experiment which is elaborated on, in this specification.

FIG. 8 is a graph showing the relationship between the thickness of a denuded zone and the length of the initial high temperature annealing period shown with the annealing temperature as the parameter. FIG. 8 shows results of an experimental process comprising an initial high temperature annealing conducted at a temperature range of 1,000° through 1,200° C., for a time period from 10 minutes to 10 hours, a temperature decrease period in which the temperature is decreased to 650° C. at a rate of 5° C./min., a low temperature annealing for 3 hours at 650° C., a temperature increase period in which the temperature is increased from 650° C. to 1,100° C. at a rate of 2° C./min., a high temperature annealing conducted for 0.5 hours at 1,100° C. and a temperature decreasing period in which the temperature is decreased from 1,100° C. to 650° C. at a rate of 5° C./min. Referring to FIG. 8, a higher initial annealing temperature causes a larger thickness of a denuded zone. A longer initial annealing period also causes a larger thickness of a denuded zone. This means that the thickness of a denuded zone can also be controlled by the temperature or time period of the initial annealing.

It is preferable that an Si wafer be covered by a protective film e.g. an $SiO_2$ film, during the thermal process. However, rather than employing such a protective film, an oxidizing gas can be employed as the atmosphere for the thermal process so that the surface of the Si wafer is protected by an $SiO_2$ film which grows on the Si wafer during the thermal process, albeit an inert gas is preferable from the viewpoint of the control of the thickness of a denuded zone. Therefore, it is effective that the initial high temperature annealing process be conducted in an oxidizing gas and that the later processes be conducted in an inert gas, because an $SiO_2$ film will have grown during the initial high temperature annealing process.

The foregoing description has clarified that an improvement to enable a better control of the thickness of a denuded zone particularly for an Si wafer having a high concentration of oxygen is realized in a method for producing an Si wafer which utilizes the function of the intrinsic gettering effect in accordance with one embodiment of the present invention.

Third, described below is an effective method to maintain a denuded zone once produced in an Si wafer even during a later thermal process included in a process for producing of a semiconductor device. The method is also effective to inhibit a semiconductor wafer from warping during the thermal process.

An Si wafer is inevitably exposed to high temperature in excess of 950° C. during a process for producing a semiconductor device because the process contains impurity diffusion, oxidation, et al. An intrinsic gettering effect is preferably utilized during this process. However, a denuded zone once produced in an Si wafer is often lost during this process for production of a semiconductor device. The object of this embodiment is to inhibit the loss of a denuded zone produced in an Si wafer during a process for production of a semiconductor device, allowing an intrinsic gettering effect to function well.

Figure 9:
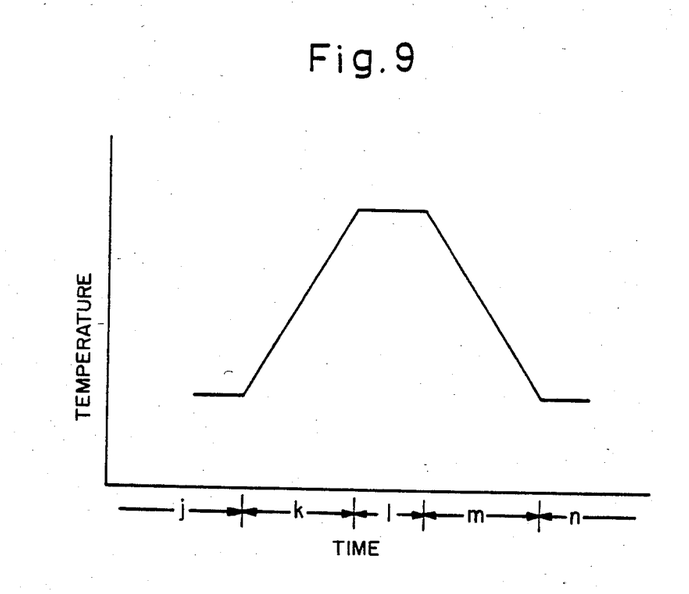
FIG. 9 is a graph of the temperature vs. time tendency of the thermal cycles of a method in accordance with yet another embodiment of the present invention.

FIG. 9 illustrates the temperature vs. time tendency of the thermal cycles of a method in accordance with this embodiment as applied to a process for producing a gate oxide film of a MOS transistor. Referring to FIG. 9, j, k, l, m and n are, respectively, a low temperature annealing period in which an Si wafer is annealed for 7 minutes at 900° C., a temperature increasing process in which the temperature is increased to 1,050° C. at a rate of 10° C./min., a high temperature annealing period in which the Si wafer is annealed for 10 minutes at 1,050° C., a temperature decreasing process in which the temperature is decreased to 900° C. at a rate of 5° C./min., and a low temperature period at a temperature of 900° C. After the temperature is decreased to 900° C., the Si wafer is taken out of a furnace. By this process, a gate oxide film having the thickness of 350 through 400 angstroms is produced. Since the object of this process is oxidation, the atmosphere is dry oxygen.

Since the feature of this embodiment is that both a temperature increase period and a temperature decrease period are utilized, a significant temperature gap is required between the high temperature and the low temperature. Therefore, the low temperature can be selected from a range of 500° through 900° C., preferably a range of 600° through 700° C. and the high temperature can be selected from a range of 950° through 1,300° C. The preferred temperature increase rate as well as the preferred temperature decrease rate is 14° C./min. because a delay in heat transmission must be taken into account. Since the object of this embodiment includes reduction in the process time at a temperature higher than 1,000° C. and maintenance of crystalline defects in the deep region of an Si wafer, it is required to select the temperature increase rate and the temperature decrease rate so as not to cause dismissal of crystalline defects available in the deep region of an Si wafer. It is further required to select a temperature increase rate from the range of 5° C./min. through 14° C./min., particularly in the case where the Si wafer contains a large quantity or large concentration of oxygen. Since both a temperature increase process and a temperature decrease process function only in a positive direction insofar as the growth of a denuded zone is concerned, it is possible to apply this embodiment to a process for producing a semiconductor device which contains an annealing process conducted at a temperature higher than 950° C., for the purpose of utilizing the denuded zone which was produced in an earlier phase of the process for producing the semiconductor device.

Further, it is possible to apply this embodiment to an Si wafer wherein a denuded zone has not yet been produced, since a denuded zone can be produced by the process in accordance with this embodiment.

The foregoing description has clarified that a method effective to maintain a denuded zone once produced in an Si wafer, even during a later thermal process included in a process for producing of a semiconductor device and also effective to inhibit the semiconductor wafer from warping during the thermal process is successfully realized in one embodiment of the present invention.

Fourth, described below will be a method for producing a semiconductor wafer which utilizes the function of the intrinsic gettering effect or a semiconductor wafer having a shallow or surface region of a denuded zone and a deep or internal region containing a high concentration of crystalline defects large in size. The semiconductor wafer allows an increased intrinsic gettering effect then is available from any of the methods based on an annealing process, allowing itself to be material for producing a bipolar semiconductor device.

The foregoing description repeated the efficient function of the intrinsic gettering effect to produce and maintain a denuded zone in the shallow or surface region of an Si wafer and a high concentration of crystalline defects in the deep or internal region of the same Si wafer. An Au diffusion process is available which has a similar function to the intrinsic gettering effect insofar as the bipolar semiconductor device is concerned. In order to allow an intrinsic gettering effect to replace the Au diffusion process, it is essential to produce a denuded zone having a thickness of 1 through 2 micrometers.

Each of the foregoing methods for producing an Si wafer, which utilizes the function of the intrinsic gettering effect or an Si wafer having a shallow or surface region of a denuded zone and a deep or internal region containing a high concentration of crystalline defects, is based on annealing processes. However, processes based on an annealing process are convenient particularly from the viewpoint of production. Some limitations are observed more or less from the viewpoint of function of a device. The object of this embodiment is to remove this type of limitation which can be harmful particularly for bipolar transistors.

To achieve this object, a method in accordance with this embodiment includes a first step in which an Si wafer is annealed employing a process in which the annealing temperature increases at a rate not exceeding 5° C./min. and a second step in which an epitaxial layer containing one or more impurities with one conductivity and having a thickness in excess of 2 micrometers is grown on the Si wafer.

Figure 10:
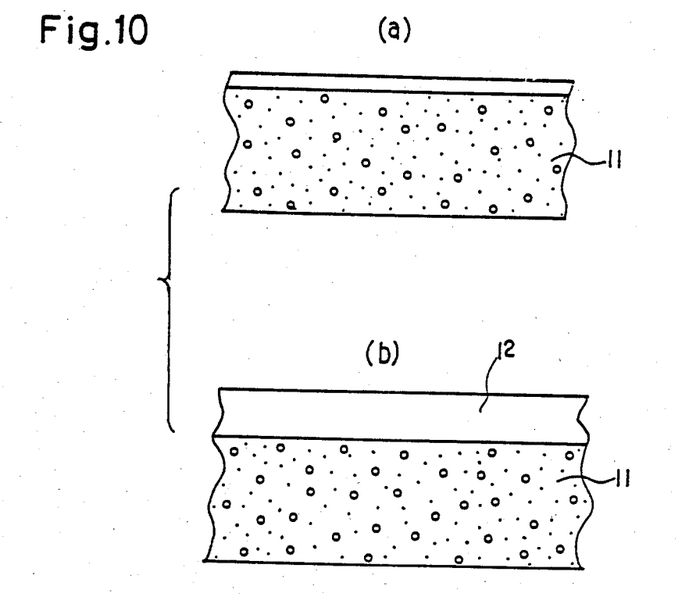
FIG. 10(a) is a cross-sectional view of an Si wafer after completion of a first step of a method in accordance with one embodiment of the present invention.
FIG. 10(b) is a cross-sectional view of an Si wafer after completion of a second step of a method in accordance with one embodiment of the present invention.

Referring to FIG. 10(a), and Si wafer 11 containing oxygen with a concentration of e.g. $2 \times 10^{18}/cm^3$ is annealed, while the annealing temperature is increased from 750° C. to 1,100° C. at a rate of 2° C./min. As frequently described earlier, the most important parameter in determining the thickness of a denuded zone is the temperature increase rate of the initial or first temperature increase phase. This initial temperature increase rate of 2° C./min. enables crystalline defects to be produced up to immediately below the surface of the Si wafer. Thereafter, the Si wafer is annealed for 30 minutes at 1,100° C. The length of time for this high temperature annealing process is preferably approximately 30 minutes, otherwise some of the crystalline defects which have not yet grown to a size larger than a critical magnitude will readily be lost. After completion of this high temperature annealing process, the annealing temperature is decreased from 1,100° C. to 750° C. at a rate of 5° C./min. In the case where a tendency is observed that an oxygen concentration of an Si wafer determines whether or not crystalline defects can be produced up to immediately below the surface of the Si wafer, plural application of the foregoing first step is effective to produce crystalline defects just close to the surface of the Si wafer. For an Si wafer containing oxygen with a concentration of $2 \times 10^{18}/cm^3$, two applications of the foregoing first step is sufficient.

Referring to FIG. 10(b), after the Si wafer is exposed to fluoric acid to remove the $SiO_2$ film grown in the previous process, an epitaxial layer 12, having a thickness range of 3 through 4 micrometers in the case of bipolar transistors, having a thickness range of 2 through 3 micrometers in the case of MOS devices or having a thickness range of 1.5 through 27 micrometers in the case of analog-IC or linear IC devices, is formed. Due to the intrinsic gettering effect caused by the high concentration of crystalline defects produced in the previous process, the epitaxial layer 12 is converted to a denuded zone.

Figure 11:
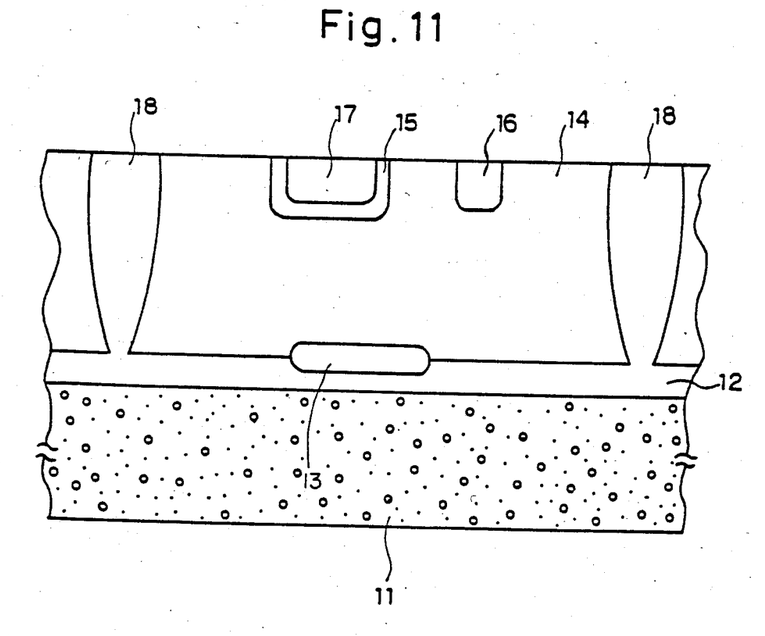
FIG. 11 is a cross-sectional view of a bipolar transistor by on an Si wafer produced employing a method in accordance with one embodiment of the present invention.

Referring to FIG. 11, a following series of processes is required to produce a bipolar transistor employing this Si wafer. A buried layer 13 of an Si layer containing impurities of one conductivity is grown on the first epitaxial layer 12, before a second epitaxial layer or a collector 14 of an Si layer containing impurities of the conductivity identical to that of the buried layer 13, is grown on the first epitaxial layer 12. Thereafter a collector terminal 16 having the conductivity identical to that of a collector 14 and a base 15 having the conductivity different from that of the collector 14 is produced in a collector 14 by means of the impurity diffusion process. An emitter 17 having the conductivity different from that of a base 15 is produced in the base 15 by means of the impurity diffusion process. When necessary, each element is insulated from each other by a region 18 having the conductivity different from that of the collector 14. In this case, a first epitaxial layer 12 is required to have the conductivity different from that of a buried layer 13.

The foregoing redundant series of processes causes an extremely large thickness of active layers 12 and 14, decreasing the intrinsic gettering effect. Therefore, it is possible to produce a buried layer before the first epitaxial layer is grown on a region containing a large quantity of crystalline defects. However, this improvement is potentially involved with a possibility in which the buried layer is connected with the region containing a large quantity of crystalline defects causing a leakage therebetween. In order to remove this drawback, a modification is available which includes a first step in which a semiconductor wafer is annealed, while the annealing temperature is increased at a rate not exceeding 5° C./min., a second step in which an epitaxial layer containing impurities with one conductivity and having a thin thickness is grown before a buried layer is produced, and a third step in which an epitaxial layer containing impurities with one conductivity and having a thickness in excess of 2 micrometers is grown on the epitaxial layer previously produced.

The foregoing description has clarified that a method for production of an Si wafer which allows for an increase in the intrinsic gettering effect than is available from any of the methods based on an annealing process, is realized in a method in accordance with this embodiment of the present invention.

The invention has been described with reference to specific embodiments, this description is not meant to be construed in a limiting sense. Various modifications of the disclosed embodiments, as well as other embodiments of this invention will be apparent to persons skilled in the art upon reference to the description of this invention. It is therefore contemplated that the appended claims will cover any such modifications or embodiments that fall within the true scope of this invention.

What is claimed is:

1. A method for producing a semiconductor device on a silicon wafer utilizing the function of the intrinsic gettering effect or a silicon wafer having a shallow or surface zone which is a denuded zone and a having deep or internal region containing a high concentration of crystalline defects which are large in size, comprising the step of annealing the silicon wafer at an annealing temperature selected from a range of 500° through 1300° C. by heating the silicon wafer such that the annealing temperature corresponds to a first temperature selected from a range of 500° through 900° C., and increasing the annealing temperature to a second temperature selected from a range of 950° through 1300° C., the annealing temperature being increased from the first temperature to the second temperature at a rate not exceeding 14° C./min.

2. A method for producing a semiconductor device, utilizing the function of the intrinsic gettering effect, as defined in claim 1, wherein said annealing step comprises increasing the annealing temperature from the first temperature to the second temperature at a rate selected from a range of 5° through 14° C./min, and wherein the silicon wafer contains a concentration of oxygen in excess of $1.5 \times 10^{18}/cm^3$.

3. A method for producing a semiconductor device, utilizing the function of the intrinsic gettering effect, as defined in claim 1, wherein said annealing step comprises increasing the annealing temperature from the first temperature to the second temperature at a rate not exceeding 5° C./min, and wherein the silicon wafer contains a concentration of oxygen not exceeding $15 \times 10^{18}/cm^3$.

4. A method for producing a semiconductor device employing a silicon wafer having a shallow region which is a denuded zone and having a deep region containing a high concentration of crystalline defects which are large in size, comprising the steps of:
 (a) annealing the silicon wafer by heating the silicon wafer such that the annealing temperature corresponds to a first temperature selected from a range of 500° through 900° C.;
 (b) annealing the silicon wafer at a second temperature selected from a range of 950° through 1300° C.; and
 (c) decreasing the annealing temperature from the second temperature to the first temperature, said annealing steps (a) and (b) including increasing the first temperature to the second temperature and decreasing the second temperature to the first temperature, both the rate of increase and decrease in temperature being selected from a rate not exceeding 14° C./min.

5. A method for producing a semiconductor device on a silicon wafer utilizing the function of the intrinsic gettering effect, or a silicon wafer having a shallow or surface region which is a denuded zone and having a deep or internal region containing a high concentration of crystalline defects which are large in size, comprising the steps of:
 (a) annealing the silicon wafer at an annealing temperature selected from a range of 500° through 1300° C. by heating the silicon wafer such that the annealing temperature corresponds to a first temperature selected from a range of 500° through 900° C. and increasing the annealing temperature to a second temperature selected from a range of 950° through 1300° C., the annealing temperature being increased from the first temperature to the second temperature at a rate not exceeding 14° C./min.; and
 (b) growing a silicon epitaxial layer on the silicon wafer, the silicon epitaxial layer comprising at least one impurity and having a thickness between 2 and 27 micrometers.

6. A method for producing a semiconductor device utilizing the function of the intrinsic gettering effect as defined in claim 5, wherein the annealing temperature of said annealing step (a) is increased to approximately 1,100° C.

7. A method for producing a semiconductor device, utilizing the function of the intrinsic gettering effect, as defined in claim 5 or 6, wherein said annealing step (a) comprises the substeps of:
 increasing the temperature at a first rate; and
 increasing the temperature at a second rate greater than that of the first rate.

8. A method for producing a bipolar transistor on a silicon wafer utilizing the function of the intrinsic gettering effect, or a silicon wafer having a shallow or surface region which is a denuded zone and having a deep or internal region containing a high concentration of crystalline defects which are large in size, comprising the steps of:
 (a) annealing the silicon wafer at an annealing temperature selected from a range of 500° through 1300° C. by heating the silicon wafer such that the annealing temperature corresponds to a first temperature selected from a range of 500° through 900° C., and increasing the annealing temperature to a second temperature selected from a range of 950° through 1300° C., the annealing temperature being increased from the first temperature to the second temperature at a rate not exceeding 14° C./min.;
 (b) growing, on the silicon wafer, a thin silicon epitaxial layer having a top portion and comprising at least one impurity;
 (c) introducing a high concentration of at least one impurity into a selected portion of the top portion of the thin silicon epitaxial layer for forming a buried layer;
 (d) growing, on the buried layer and the top portion of the thin silicon epitaxial layer, a thick silicon epitaxial layer comprising at least one impurity and having a thickness between 2 and 27 micrometers; and (e) forming base, emitter and collector regions in the thick silicon epitaxial layer, the impurity concentration of the buried layer being higher than the impurity concentration of the thick silicon epitaxial layer.

9. A method for producing a bipolar transistor, utilizing the function of the intrinsic gettering effect, as defined in claim 8, wherein the annealing temperature of said annealing step (a) is increased to approximately 1,100° C.

10. A method for producing a bipolar transistor, utilizing the function of the intrinsic gettering effect, as defined in claim 8 or 9, wherein said annealing step (a) comprises the substeps of:
increasing the temperature at a first rate;
increasing the temperature at a second rate greater than that of the first rate.

11. A method for producing a semiconductor device on a silicon wafer utilizing the function of the intrinsic gettering effect or a silicon wafer having a shallow or surface region which is a denuded zone and having a deep or internal region containing a high concentration of large cyrstalline defects, comprising the step of annealing the silicon wafer at an annealing temperature selected from a range of 500° through 1300° C. by heating the silicon wafer so that the annealing temperature corresponds to a first temperature selected from a range of 500° to 900° C., and increasing the annealing temperature toward a second temperature selected from a range of 950° to 1300° C., the annealing temperature being increased from the first temperature toward the second temperature at a rate not exceeding 14° C./min.

12. A method for producing a semiconductor device, utilizing the function of the intrinsic gettering effect, as defined in claim 11, wherein said annealing step comprises increasing the annealing temperature from the first temperature toward the second temperature at a rate selected from a range of 5° to 14° C./min., and wherein the silicon wafer contains a concentration of oxygen greater than $1.5 \times 10^{18}/cm^3$.

13. A method for producing a semiconductor device, utilizing the function of the intrinsic gettering effect, as defined in claim 11, wherein said annealing step comprises increasing the annealing temperature from the first temperature toward the second temperature at a rate not exceeding 5° C./min., and wherein the silicon wafer contains a concentration of oxygen not exceeding $1.5 \times 10^{18}/cm^3$.

14. A method for producing a semiconductor device on a silicon wafer utilizing the function of the intrinsic gettering effect or a silicon wafer having a shallow or surface region which is a denuded zone and having a deep or internal region containing a high concentration of large crystalline defects, comprising the steps of:
(a) annealing the silicon wafer, at an annealing temperature selected from a range of 500° through 1300° C. by heating the silicon wafer, such that the annealing temperature corresponds to a first annealing temperature selected within the range of 950° C. through 1300° C., for a period of time from 10 minutes to 10 hours;
(b) annealing the silicon wafer by heating the silicon wafer at a second annealing temperature selected within the range of 500° C. through 900° C.; and
(c) increasing the annealing temperature toward a third annealing temperature selected within the range of 950° C. through 1300° C., the annealing temperature increased from the second annealing temperature toward the third annealing temperature at a rate not exceeding 14° C./min.

15. A method for producing a semiconductor device, utilizing the function of the intrinsic gettering effect, as defined in claim 14, wherein said increasing step (c) comprises increasing the annealing temperature from the second annealing temperature at a rate not exceeding 5° C./min.

16. A method for producing a semiconductor device in a silicon wafer utilizing the function of the intrinsic gettering effect or a silicon wafer having a shallow or surface region which is a denuded zone and having a deep or internal region containing a high concentration of large crystalline defects, comprising the steps of:
(a) annealing the silicon wafer at an annealing temperature selected from a range of 500° through 1300° C. by heating the silicon wafer such that the annealing temperature corresponds to a first temperature selected from a range of 950° through 1300° C., for a period of time from 10 minutes to 10 hours;
(b) decreasing the annealing temperature from the first annealing temperature;
(c) increasing the annealing temperature through a second temperature selected from a range of 500° through 900° C. toward a third temperature selected from a range of 950° through 1300° C., the annealing temperature being increased from the second temperature toward the third temperature at a rate not exceeding 14° C./min.; and
(d) annealing the silicon wafer at the third temperature.

17. A method for producing a semiconductor device on a silicon wafer utilizing the function of the intrinsic gettering effect as set forth in claim 2, wherein said step of increasing the annealing temperature from the first temperature to the second temperature is at a rate not exceeding 14° C./min.

18. A method for producing a semiconductor device on a silicon wafer utilizing the function of the intrinsic gettering effect as set forth in claim 3, wherein said step of increasing the annealing temperature from the first temperature to the second temperature is at a rate not exceeding 14° C./min.

19. A method for producing a semiconductor device on a silicon wafer utilizing the function of the intrinsic gettering effect as set forth in claim 4, further comprising the step of employing an oxidizing gas as an atmosphere for producing a gate oxide film on the silicon wafer by a thermal process.

20. A method for producing a semiconductor device on a silicon wafer utilizing the function of the intrinsic gettering effect as set forth in claim 4, further comprising selecting the temperature increase rate from a range of 5° through 14° C./min.

21. A method for producing a semiconductor device on a silicon wafer utilizing the function of the intrinsic gettering effect as set forth in claim 1, wherein said annealing step comprises increasing the annealing temperature from the first temperature to the second temperature at a rate selected from a range of 1° through 14° C./min.

22. A method for producing a semiconductor device on a silicon wafer utilizing the function of the intrinsic gettering effect as set forth in claim 11, wherein said annealing step comprises increasing the annealing temperature from the first temperature to the second temperature at a rate selected from a range of 1° through 14° C./min.

23. A method for producing a semiconductor device on a silicon wafer utilizing the function of the intrinsic gettering effect as set forth in claim 14, wherein said step (c) comprises increasing the second annealing temperature toward the third annealing temperature at a rate selected from the range of 1° through 5° C./min.

24. A method for producing a semiconductor device on a silicon wafer utilizing the function of the intrinsic gettering effect as set forth in claim 15, wherein said step (c) further comprises increasing the second annealing temperature toward the third annealing temperature at a rate selected from the range of 1° through 5° C./min.

25. A method for producing a semiconductor device on a silicon wafer utilizing the function of the intrinsic gettering effect as set forth in claim 16, wherein said step (c) comprises increasing the second temperature toward the third temperature at a rate selected from the range of 1° through 5° C./min.

* * * * *

UNITED STATES PATENT AND TRADEMARK OFFICE
CERTIFICATE OF CORRECTION

PATENT NO. : 4,597,804

DATED : July 1, 1986

INVENTOR(S) : Kazunori Imaoka

It is certified that error appears in the above-identified patent and that said Letters Patent is hereby corrected as shown below:

Col. 2, line 26, "is" should be --is,--;
       line 27, "region," should be --region;--;
       line 59, "The" should be --A--.

Col. 5, line 24, "this" should be --the--;
       line 36, "this" should be --the--;
       line 48, "by" should be --produced--; and "produced" should be --by--;
       line 56, "presented;" should be --presented--.

Col. 7, line 52, delete "of".

Col. 9, in the equation, "$\approx$" should be --$\fallingdotseq$--.

Col. 10, line 39, delete "minutes" (second occurrence).

UNITED STATES PATENT AND TRADEMARK OFFICE
CERTIFICATE OF CORRECTION

PATENT NO. : 4,597,804
DATED : JULY 1, 1986
INVENTOR(S) : KAZUNORI IMAOKA

It is certified that error appears in the above-identified patent and that said Letters Patent is hereby corrected as shown below:

Col. 11, line 56, "film" (first occurrence) should be --film,--.

Col. 12, line 11, delete "of".

Col. 14, line 38, "13," should be --13--;
        line 40, "the" should be --a--;
        line 41, "a" (first occurrence) should be --the--; and "the" should be --a--;
        line 43, "a" should be --the--;
        line 44, "the" should be --a--;
        line 45, "a" should be --the--;
        line 48, "the" should be --a--;
        line 50, "the" should be --a--;
        line 51, "a" should be --the--.

Col. 15, line 24, "a having" should be --having a--.

Signed and Sealed this

Twenty-eighth Day of October, 1986

[SEAL]

*Attest:*

DONALD J. QUIGG

*Attesting Officer*      *Commissioner of Patents and Trademarks*